United States Patent
Hong

(10) Patent No.: US 7,157,764 B2
(45) Date of Patent: Jan. 2, 2007

(54) SEMICONDUCTOR DEVICE HAVING ISOLATION PATTERN IN INTERLAYER INSULATING LAYER BETWEEN CAPACITOR CONTACT PLUGS AND METHODS OF FABRICATING THE SAME

(75) Inventor: Sang-Woo Hong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/001,596

(22) Filed: Nov. 30, 2004

(65) Prior Publication Data

US 2005/0116274 A1 Jun. 2, 2005

(30) Foreign Application Priority Data

Dec. 2, 2003 (KR) .................. 10-2003-0086965

(51) Int. Cl.
*H01L 27/108* (2006.01)
(52) U.S. Cl. ....................... 257/303; 257/306
(58) Field of Classification Search ............... 257/303, 257/306
See application file for complete search history.

(56) References Cited

U.S. PATENT DOCUMENTS 5,597,756 A 1/1997 Fazan et al.
6,150,230 A * 11/2000 Kotecki et al. ............. 438/399
6,501,119 B1 12/2002 Ohno

FOREIGN PATENT DOCUMENTS

KR 2001-0111864 12/2001
KR 2002-0025331 4/2002

OTHER PUBLICATIONS

English language abstract of Korean Publication No. 2001-0111864.
English language abstract of Korean Publication No. 2002-0025331.

* cited by examiner

*Primary Examiner*—Jack Chen
(74) *Attorney, Agent, or Firm*—Marger Johnson & McCollom, P.C.

(57) ABSTRACT

A semiconductor device having an isolation pattern inside an interlayer insulating layer between capacitor contact plugs and methods of fabrication the same: The semiconductor device includes an interlayer insulating layer covering a semiconductor substrate. At least two contact plugs passing the interlayer insulating layer and connected to the semiconductor substrate. An insulating layer pattern, which is formed of a material having an etch rate lower than that of the interlayer insulating layer, covers the interlayer insulating layer between the neighboring contact plugs. An isolation pattern, which is formed of a material having an etch rate lower than that of the interlayer insulating layer, is extended from the insulating layer pattern and located inside the interlayer insulating layer between the neighboring contact plugs. A charge storage electrode contacts the contact plug.

10 Claims, 12 Drawing Sheets

SEMICONDUCTOR DEVICE HAVING ISOLATION PATTERN IN INTERLAYER INSULATING LAYER BETWEEN CAPACITOR CONTACT PLUGS AND METHODS OF FABRICATING THE SAME

CROSS-REFERENCE TO RELATED APPLICATION

This application claims priority from Korean Patent Application No. 2003-86965, filed Dec. 2, 2003. The entire disclosure of Korean Patent Application No. 2003-86965 is hereby incorporated herein by reference.

BACKGROUND OF THE INVENTION

1. Field of the Invention

The present invention relates to semiconductor devices, and more particularly, to the fabrication of semiconductor devices.

2. Description of the Related Art

The process used to form capacitors is very important when manufacturing semiconductor devices with reduced design rules. A great deal of effort has been expended developing processes to form capacitors which occupy small areas.

In general, the capacitance of a capacitor is determined by the area of the capacitor and the dielectric constant of the dielectric layer. The area of the capacitor is determined by the effective area of the dielectric layer located between the storage electrode and the plate electrode of the capacitor. In general, the magnitude of the capacitance of a capacitor is proportional to the effective area of the dielectric layer. NO (nitride-oxide) is often used as a dielectric layer for capacitors. The NO (nitride-oxide) dielectric layer can be replaced by a high-k dielectric layer such as $Ta_2O_5$, $Al_2O_3$, BST ((Ba, Sr) $TiO_3$). A high-k dielectric layer can be used with a metal electrode; however, use of metal electrodes presents many difficulties.

Methods have been developed to increase the effective area of a dielectric layer by modifying the charge storage electrode. A structure of three-dimensional electrodes is taught in U.S. Pat. No. 5,597,756 by Fazan, et. al., entitled "Process for fabricating a cut-shaped DRAM capacitor using a multi-layer partly-sacrificial stack".

FIGS. 1a and 1b show a prior art method of fabricating a semiconductor device having a three-dimensional electrode. FIG. 1a shows a semiconductor substrate 10 that has a lower structure including capacitor contact plugs 15. The structure shown has an interlayer insulating layer 16 and an etch stop pattern 17. A molding pattern 18 is formed on the interlayer insulating layer 16, so as to expose the capacitor contact plug 15 and the interlayer insulating layer 16 around it. The etch stop pattern 17 is formed to prevent the interlayer insulating layer 16 from being damaged during an etch process which removes the molding pattern 18.

A lower structure includes landing plugs 14, gate electrodes 11, and mask insulating layers 12. The capacitor contact plugs 15 are connected to the semiconductor substrate 10 via the landing plugs 14. The landing plugs 14 are connected to the semiconductor substrate 10 via the exposed area between spacer insulating layers 13 covering the sidewalls of the gate electrode 11 and the mask insulating layer 12.

The interlayer insulating layer 16 is formed of a material that has good flow characteristics for planarization. The interlayer insulating layer 16 having a good flow characteristic typically has a high wet etch rate. The etch rate of the material in the interlayer insulating layer 16 should be higher than the etch rate of the material in the molding pattern 18. The interlayer insulating layer 16 that is exposed around the capacitor contact plug 15 may be wet etched relatively quickly after the molding pattern 18 is formed. The wet etch creates an undercut U under the etch stop pattern 17. If the undercut U is excessively formed it may connect neighboring charge storage electrodes thereby causing a problem.

As shown in FIG. 1b, a cylindrical-shaped charge storage electrode 19 may be achieved by first, forming a conductive layer pattern on the inner walls of the molding pattern 18 and on the capacitor contact plugs 15, and by second, removing the molding pattern 18. The undercut U is covered with a conductive layer during the deposition of the conductive layer and as shown in FIG. 1b and a connection A, between of the neighboring charge storage electrodes 19 may occur. The potential of such connections deteriorate the reliability of the devices formed using the process described above.

SUMMARY OF THE INVENTION

The present invention is directed to providing a semiconductor device having an isolation pattern inside an interlayer insulating layer and between capacitor contact plugs.

Another object of the present invention is to provide methods of fabricating a semiconductor device having an isolation pattern inside an interlayer insulating layer and between capacitor contact plugs.

The present invention provides a semiconductor device that includes an interlayer insulating layer covering a semiconductor substrate. At least two contact plugs pass through the interlayer insulating layer and connect to the semiconductor substrate. Charge storage electrodes are positioned on top of and cover the contact plugs. An insulating layer pattern covers the interlayer insulating layer between the neighboring charge storage electrodes. The insulating layer has extensions that extend from the insulating layer pattern and to a location between neighboring contact plugs. The insulating layer and the extensions are formed of a material having an etch rate lower than that of the interlayer insulating layer. The extensions inhibit any current flow between adjacent charge storage electrodes.

An alternate method of forming the semiconductor device involves first forming an isolation pattern and then forming the contact plugs and the storage electrodes between the isolation patterns. The isolation patterns are located between the storage electrodes and they inhibit any current flow between adjacent charge storage electrodes.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE PREFERRED EMBODIMENTS

Figure 1A:
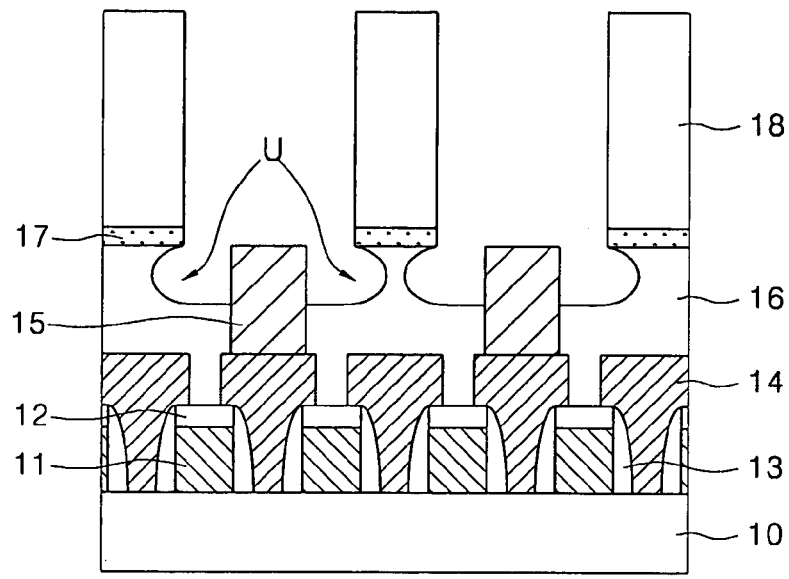
FIGS. 1a and 1b are cross-sectional views illustrating a method of fabricating a semiconductor device with conventional technology.
Figure 1B:
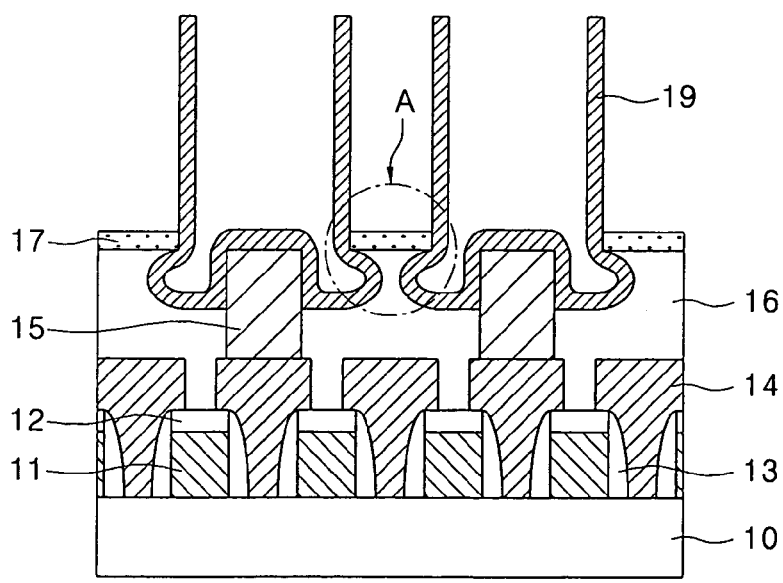

The present invention will now be described more fully hereinafter with reference to the accompanying drawings, in which preferred embodiments of the invention are shown. This invention may, however, be embodied in different forms and should not be construed as limited to the embodiments set forth herein. In the drawings, the thickness of layers and regions are exaggerated for clarity. Like numbers refer to like elements throughout the specification.

Figure 2:
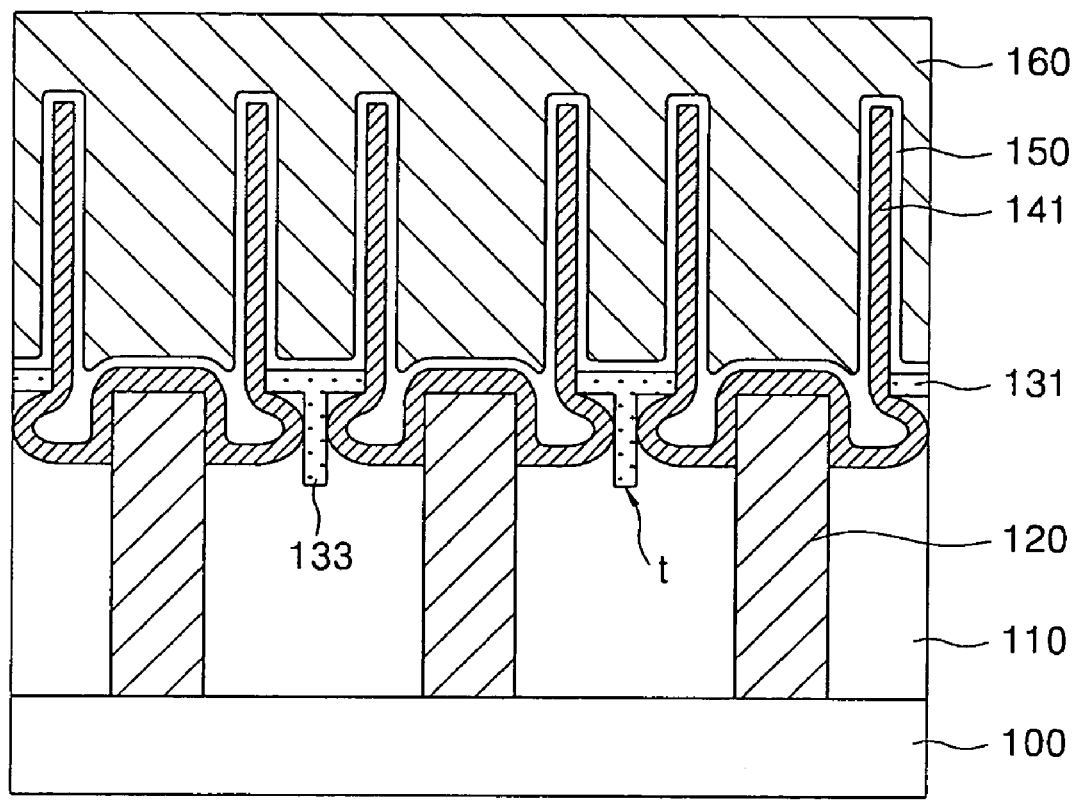
FIG. 2 is a cross-sectional view illustrating a semiconductor device according to one embodiment of the present invention.

A semiconductor device according to one embodiment of the present invention is shown in FIG. 2. As shown in FIG. 2, the semiconductor device includes an interlayer insulating layer 110 covering a semiconductor substrate 100, and at least two capacitor contact plugs 120, which penetrate the interlayer insulating layer 110. The capacitor contact plugs 120 are connected to the semiconductor substrate 100. An insulating layer pattern 131 is formed of a material that has a lower etch rate than that of the interlayer insulating layer 110. Insulating layer pattern 131 covers the interlayer insulating layer 110 between the neighboring capacitor contact plugs 120. A charge storage electrode 141 contacts the capacitor contact plug 120.

An isolation pattern 133 extends from the insulating layer pattern 131. The isolation pattern 133 is formed of a material having a lower etch rate than that of the interlayer insulating layer 110. The isolation pattern 133 is located inside the interlayer insulating layer 110 between the sidewalls of the capacitor contact plugs 120, and it functions to prevent the connection of the neighboring charge storage electrodes 141. The interlayer insulating layer 110 has trenches, and the isolation pattern 133 is formed by an insulating layer that fills the trenches.

Figure 3:
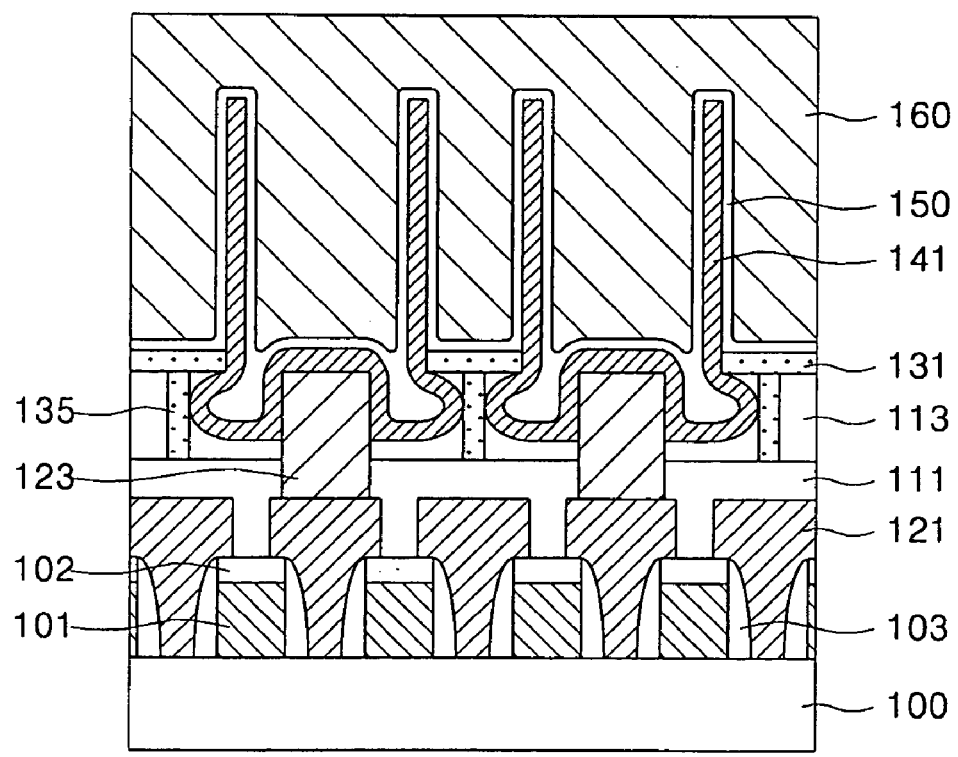
FIG. 3 is a cross-sectional view illustrating a semiconductor device according to another embodiment of the present invention.

A semiconductor device according to another embodiment of the present invention will be explained in reference to FIG. 3. A first interlayer insulating layer 111 and a second, interlayer insulating layer 113 are sequentially stacked on a semiconductor substrate 100. At least two capacitor contact plugs 123 penetrate the first and the second interlayer insulating layers 111, 113. The contact plugs 123 are connected to the semiconductor substrate 100 through landing plugs 121. The landing plugs 121 are connected to the semiconductor substrate 100, which is exposed between spacer insulating layers 103 covering the sidewalls of gate electrodes 101 and mask insulating layers 102. An insulating layer pattern 131 covers the second interlayer insulating layer 113 between the neighboring capacitor contact plugs 123. The insulating layer pattern 131 is formed of a material having an etch rate lower than the etch rate of the second interlayer insulating layer 113.

An isolation pattern 135 is located inside the second interlayer insulating layer 113 between the sidewalls of the capacitor contact plugs 123. Isolation pattern 135 is formed of a material having an etch rate lower than the etch rate of the second interlayer insulating layer 113. The isolation pattern 135 prevents those neighboring charge storage electrodes of capacitors from being connected to each other.

The charge storage electrode 141 of the semiconductor device according to one embodiment and another embodiment of the present invention may have a cylindrical shape. The charge storage electrode 141 may cover the top surface and the sidewalls of the capacitor contact plug 123.

A method of fabricating a semiconductor device according to one embodiment of the present invention will be explained in reference to FIGS. 4a to 4h, FIG. 5, and FIGS. 6a and 6b.

Figure 4A:
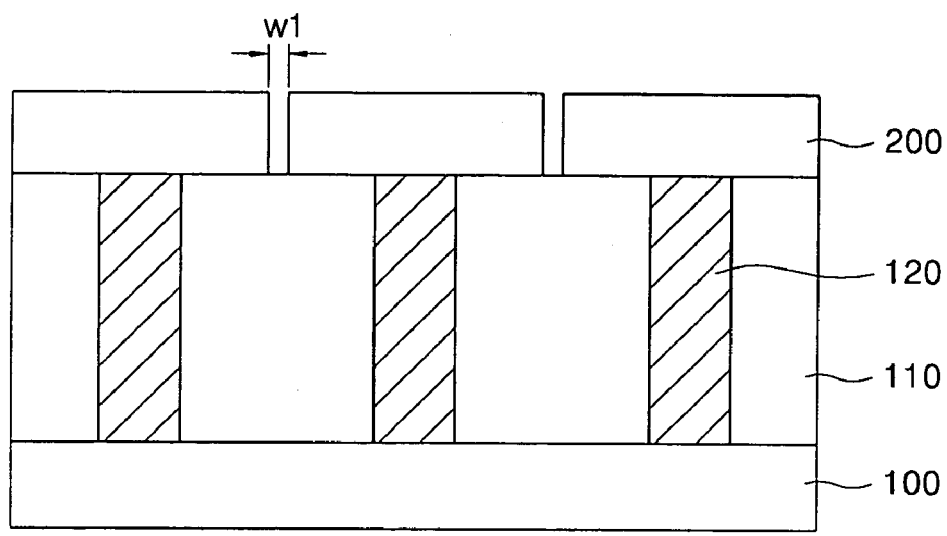
FIGS. 4a to 4h are cross-sectional views illustrating a method of fabricating a semiconductor device according to an embodiment of the present invention.

Referring to FIG. 4a, an interlayer insulating layer 110 is formed on a semiconductor substrate 100. At least two capacitor contact plugs 120 are formed to penetrate the interlayer insulating layer 110 and connected to the semiconductor substrate 100. The interlayer insulating layer 110 may be formed of a borophosphosilicate glass (BPSG), phosphosilicate glass (PSG), or undoped silicate glass (USG) having good planarization characteristics.

Then, an etch mask pattern 200 is formed to expose the interlayer insulating layer 110 between the capacitor contact plugs 120. The width of the interlayer insulating layer 110 exposed by the etch mask pattern 200 is designated "W1".

Figure 4B:
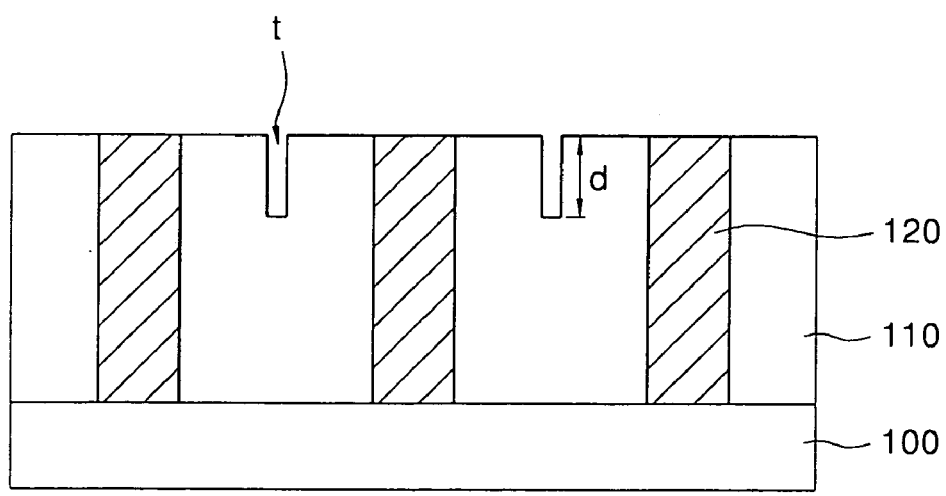

Referring to FIG. 4b the interlayer insulating layer 110 is etched using the etch mask pattern 200 as an etch mask so as to form a trench designated "t" inside the interlayer insulating layer 110 between the neighboring capacitor contact plugs 120. Then, the etch mask pattern 200 is removed. The trench t surrounds the upper portion of the capacitor contact plugs 120. The depth of the trench t may be determined by the extent of the etch amount of the interlayer insulating layer 110 in a subsequent cleaning process.

Figure 4C:
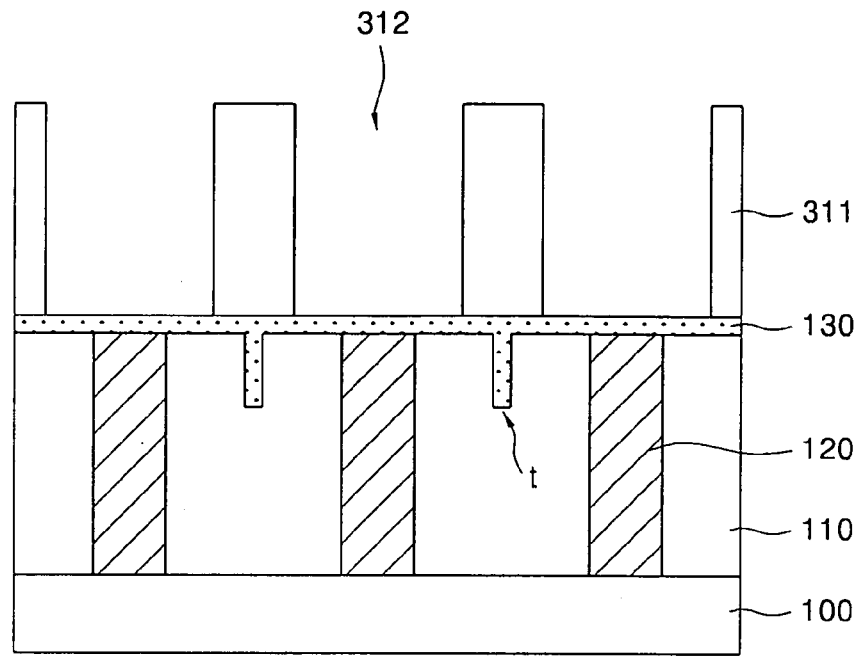

Referring to FIG. 4c, an insulating layer 130 is formed to cover the interlayer insulating layer 110 and the capacitor contact plugs 120, and to fill the trench t. Then, a molding pattern 311 is formed on the insulating layer 130.

The insulating layer 130 may be formed of SiN. The molding pattern 311 has a first opening 312 exposing the insulating layer 130 at its bottom. The first opening 312 overlaps the capacitor contact plugs 120 and has a width greater than that of the contact plugs 120. The molding pattern 311 is preferably formed of a material having an etch rate, which is higher than that of the insulating layer 130, and lower than that of the interlayer insulating layer 110. The molding pattern 311 may be formed of oxide formed by a plasma enhanced chemical vapor deposition method (PE-CVD).

Figure 4D:
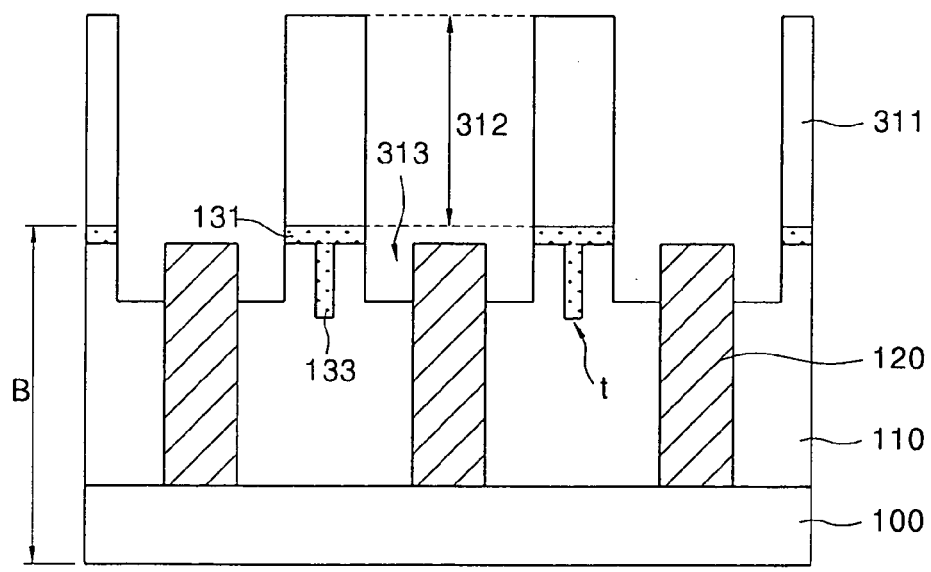

Referring to FIG. 4d, the insulating layer 130 at the bottom of the first opening 312 is removed, to expose the capacitor contact plug 120 and the interlayer insulating layer 110 around the capacitor contact plug 120, so as to form a second opening 313. At this time, the upper sidewalls of the capacitor contact plugs 120 are exposed by performing an over-etch.

The insulating layer 130 remaining under the molding pattern 311 with the formation of the second opening 313 forms an insulating layer pattern 131. The insulating layer 130 remaining inside the trench t forms an isolation pattern 133 surrounding the capacitor contact plugs 120. The insulating layer pattern 131 and the isolation pattern 133 are connected to each other, to form a "T"-shaped pattern.

Figure 5:
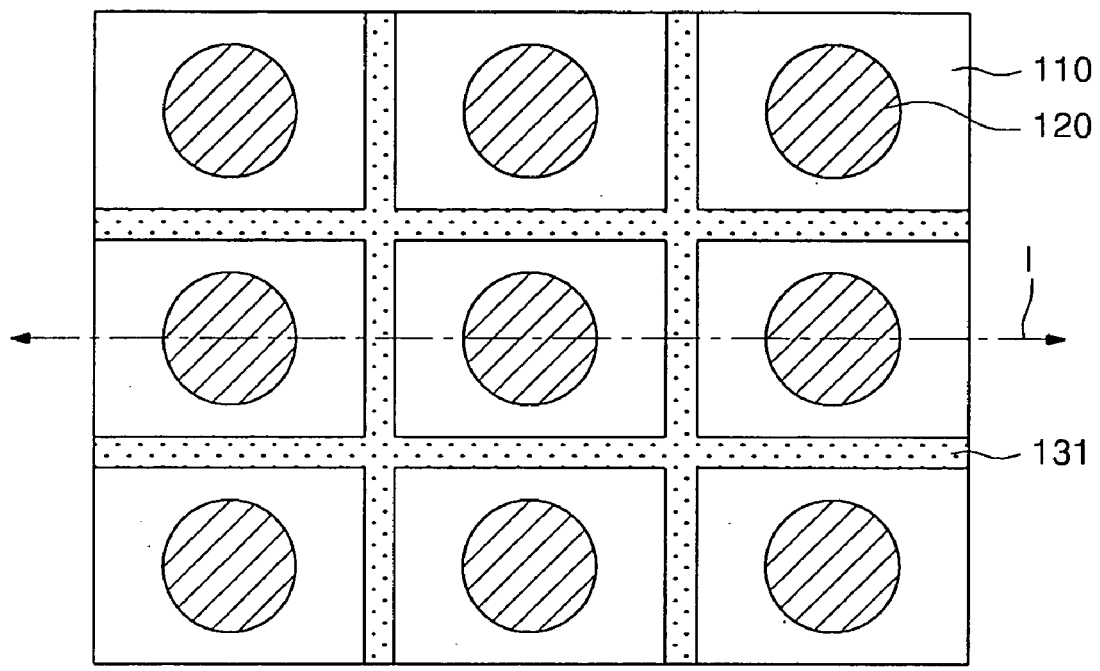
FIG. 5 is a top plan view illustrating a method of fabricating a semiconductor device according to one embodiment of the present invention.

FIG. 5 is a top plan view illustrating the layout of the insulating layer pattern 131 and the capacitor contact plug 120. A lower structure B of FIG. 4d corresponds to a section structure taken along the line of I of FIG. 5.

Figure 4E:
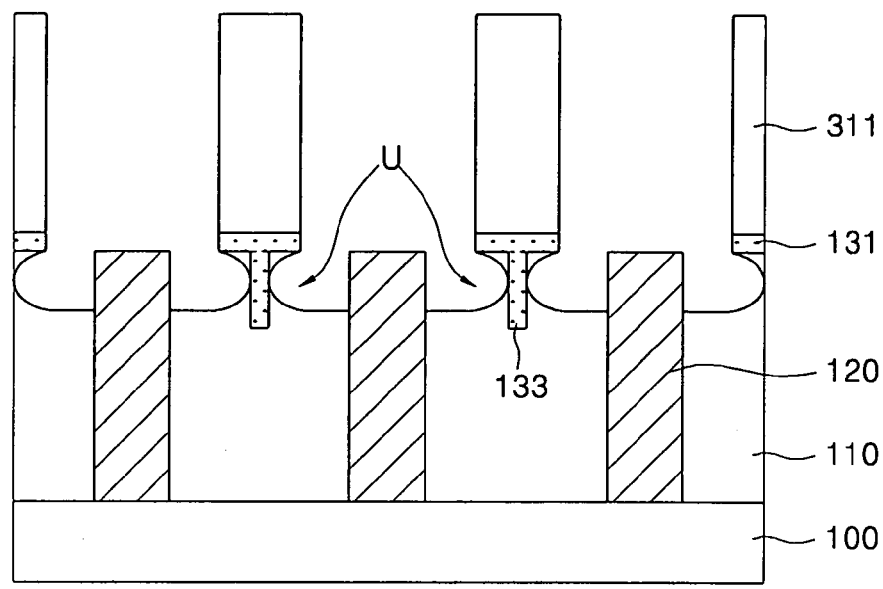

Referring to FIG. 4e, a cleaning process is performed. The cleaning process may be performed using an etch containing HF.

During the cleaning process, the interlayer insulating layer 110 under the insulating layer pattern 131 may be removed, so as to form an undercut U. In the cleaning process, the isolation pattern 133 functions as an etch stop layer. Thus, even though the undercut U is formed excessively during the cleaning process, a connection of the neighboring capacitors is avoided by the isolation pattern 133.

Figure 4F:
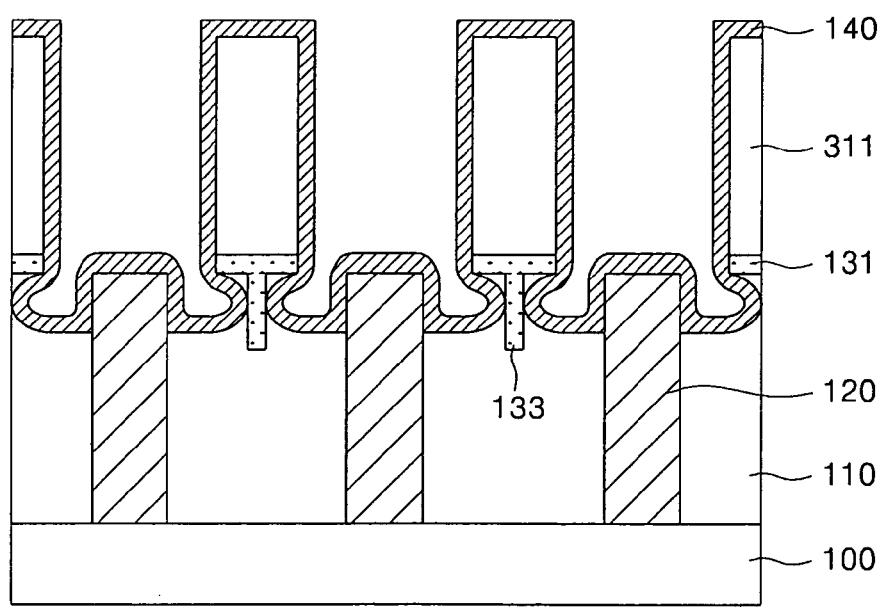

Referring to FIG. 4f, a conductive layer 140 to be a charge storage electrode of a capacitor is formed on the semiconductor substrate 100 having the molding pattern 311 and the insulating layer pattern 131.

The conductive layer 140 may be formed with a thickness having a topology of the molding pattern 311, the insulating layer pattern 131, the capacitor contact plugs 120, and the interlayer insulating layer 110 around the capacitor contact plugs 120. The conductive layer 140 is preferably formed of polysilicon.

Figure 4G:
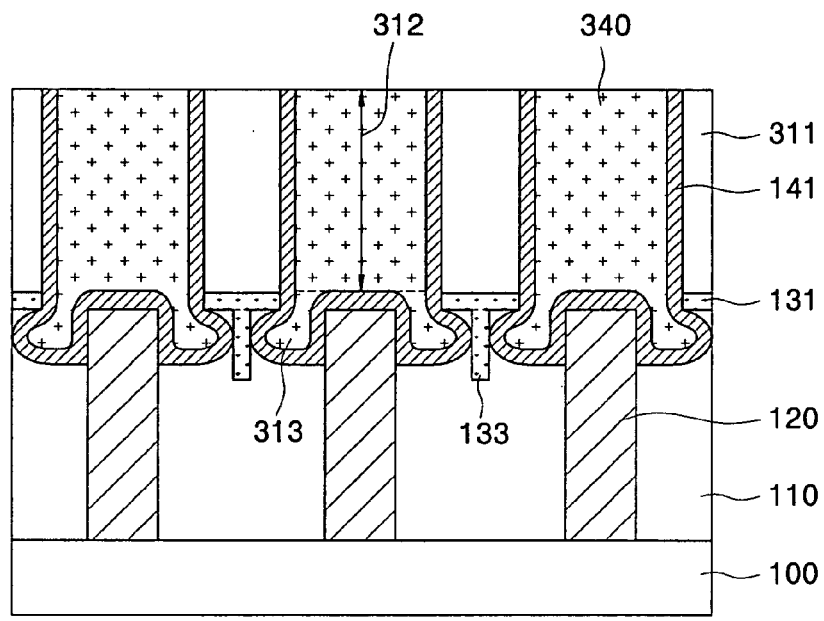

Referring to FIG. 4g, a sacrificial material layer covering the conductive layer 140 is formed to fill the first opening 312 and the second opening 313. The sacrificial material layer may be a BPSG layer or of a photoresist layer. Then, the upper portion of the sacrificial material layer and the conductive layer 140 are removed until the upper surface of the molding pattern 311 is exposed, so as to form a plurality of charge storage electrodes 141. The storage electrodes are separated from each other and at this point a sacrificial layer 340 remains in the first opening 312 and the second opening 313.

Figure 4H:
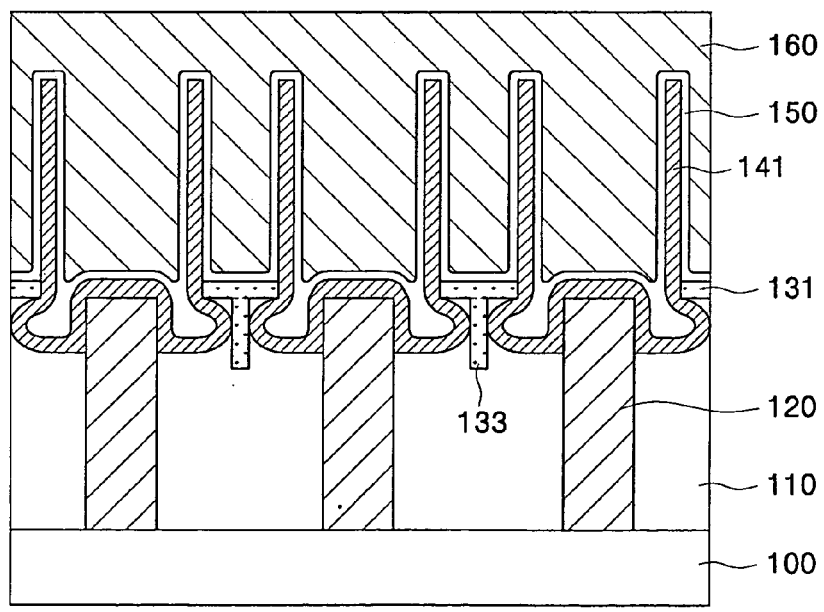

Referring to FIG. 4h, the sacrificial layer 340 and the molding pattern 311 are removed, so as to expose the charge storage electrodes 141.

Then, a dielectric layer 150 and a plate electrode 160 are sequentially formed on the charge storage electrodes 141, so as to provide the semiconductor device as shown in FIG. 2.

In the case of a highly-integrated semiconductor device, the interval between the neighboring capacitor contact plugs 120 is small. Thus, as shown in FIG. 4a, the width W1 exposed by the etch mask patterns 200 should be small in relation to the interval between the capacitor contact plugs 120. The exposed width W1 may be varied depending on the formation method of the etch mask patterns 200.

Figure 6A:
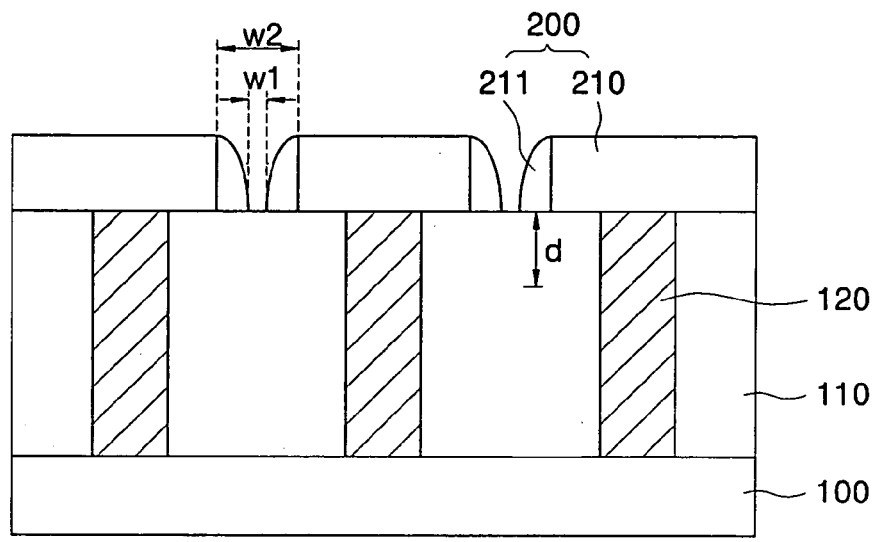
FIGS. 6a and 6b are cross-sectional views illustrating a method of forming an etch mask pattern according to another embodiment of the present invention.

Methods of forming a mask pattern according to one embodiment of the present invention will be explained in reference to FIGS. 6a and 6b. First etch mask patterns 210 are formed on the interlayer insulating layer 110. The patterns 210 expose a portion of the interlayer insulating layer 110 between the capacitor contact plugs 120. A width W2 of a portion of the interlayer insulating layer 110 exposed by the first etch mask patterns 210 may depend on the technical limitations of the current photolithography process. Then, second spacer-shaped etch mask patterns 211 are formed on the sidewalls of the first etch mask patterns 210. The second etch mask patterns 211 form an etch mask pattern 200 along with the first etch mask patterns 210. According to one aspect of the present invention, the first etch mask patterns 210 and the second etch mask patterns 211 are preferably formed of a material having an etch selectivity with respect to the capacitor contact plug 120 and the interlayer insulating layer 110.

The width W1 of the interlayer insulating layer 110 exposed after forming the second etch mask patterns 211 is smaller than the width W2 of the interlayer insulating layer 110 exposed after forming the first etch mask patterns 210. Thus, the interlayer insulating layer 110 may be exposed by the width W1 which is less than the width W2. The width W2 is determined by the technical limitations of the photolithography process.

Figure 6B:
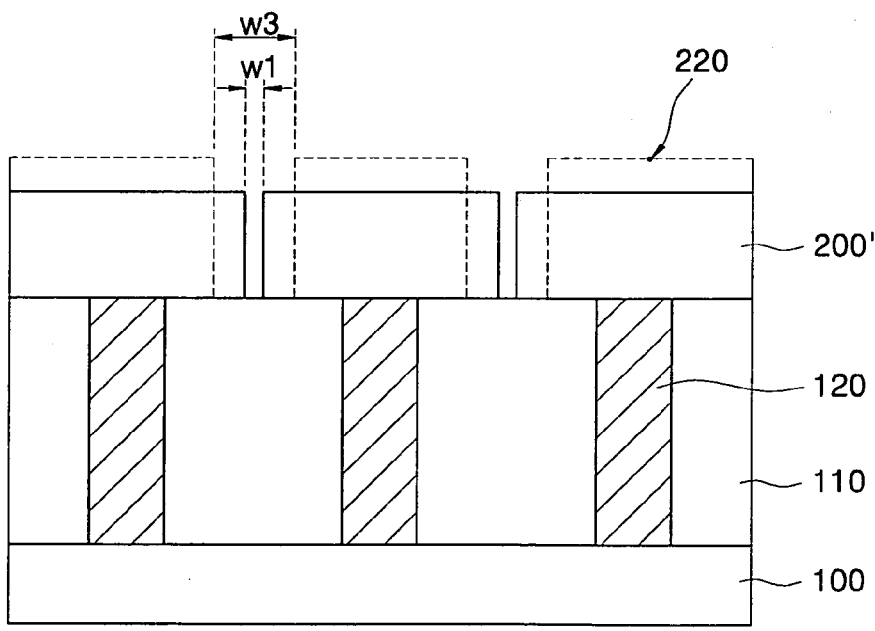

In some embodiments of the present invention, an etch mask pattern 200' may be formed using a photoresist flow technique as illustrated in FIG. 6b. Referring to FIG. 6b, photoresist is coated on the interlayer insulating layer 110 and capacitor contact plugs 120. The photoresist is exposed, and developed, so as to from photoresist patterns 220 exposing a portion of the interlayer insulating layer 110 between the capacitor contact plugs 120. A width W3 of a portion of the interlayer insulating layer 110 exposed by the photoresist patterns 220 may be determined by the technical limitations of the photolithography process. Then, the photoresist pattern 220 is thermally treated to cause a deprotection reaction, and to flow. As a result, the etch mask pattern 200' is formed. At this point mask pattern 200' is reduced in height and increased in width as compared to the photoresist pattern 220. The width W1 of the interlayer insulating layer 110, exposed after forming the etch mask patterns 200, is smaller than the width W3 of the interlayer insulating layer 110 exposed after forming the photoresist pattern 220. Thus, the interlayer insulating layer 110 may be exposed by the reduced width W1 rather than the width W3 which was dictated by the limitation of the photolithography process.

The above described method forms isolation patterns by forming trenches inside the interlayer insulating layer between the neighboring capacitor contact plugs. This prevents the transmission of charge between the electrodes. The following is a description of another embodiment of the present invention which forms isolation patterns without the use of trenches.

Figure 7A:
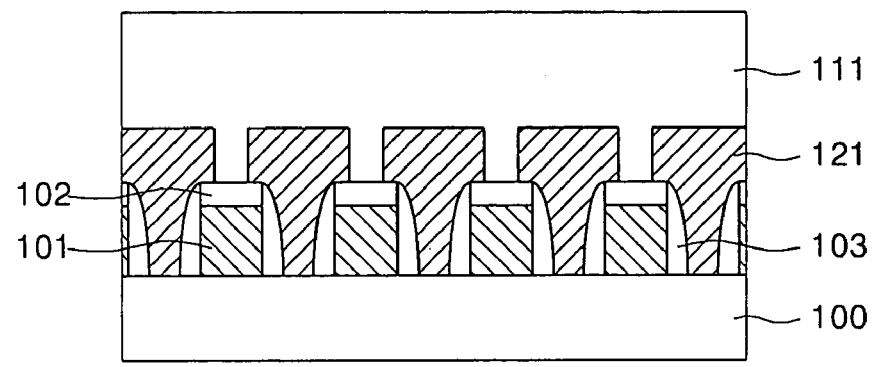
FIGS. 7a to 7e are cross-sectional views illustrating a method of fabricating a semiconductor device according to still another embodiment of the present invention.

This alternate method will be explained in reference to FIGS. 7a to 7e. Referring to FIG. 7a, insulating layer spacers 103 are formed to cover the sidewalls of gate electrodes 101 and mask insulating layers 102, which are sequentially formed on a semiconductor substrate 100. Then, landing plugs 121 are formed connected to the semiconductor substrate 100 exposed between the insulating layer spacers 103. The landing plugs 121 are formed to connect a capacitor and a bit line to the semiconductor substrate 100. Then, a first interlayer insulating layer 111 is formed to cover the semiconductor substrate 100 having the landing plugs 121 formed thereon.

Figure 7B:
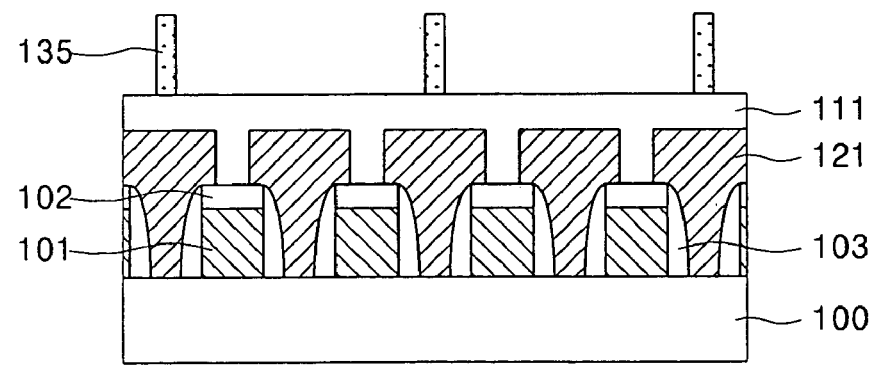

Referring to FIG. 7b, the first interlayer insulating layer 111 is planarized, and an isolation pattern 135 is formed on the planarized first interlayer insulating layer 111. The isolation pattern 135 functions to prevent the connection of the neighboring charge storage electrodes of capacitors.

Figure 7C:
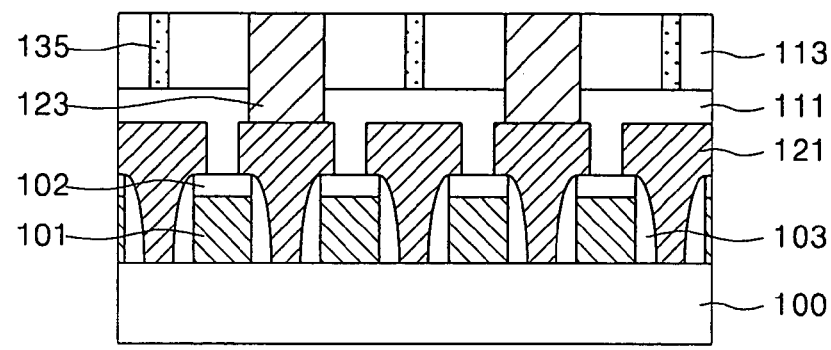

Referring to FIG. 7c, a second interlayer insulating layer 113 is formed on the semiconductor substrate 100 having the isolation pattern 135 formed thereon. Then, capacitor contact plugs 123 are formed to penetrate the second interlayer insulating layer 113 and the first interlayer insulating layer 111. The contact plugs 123 connect to the landing plugs 121. Upper portions of the capacitor contact plug 123 are surrounded by the isolation pattern 135.

Figure 7D:
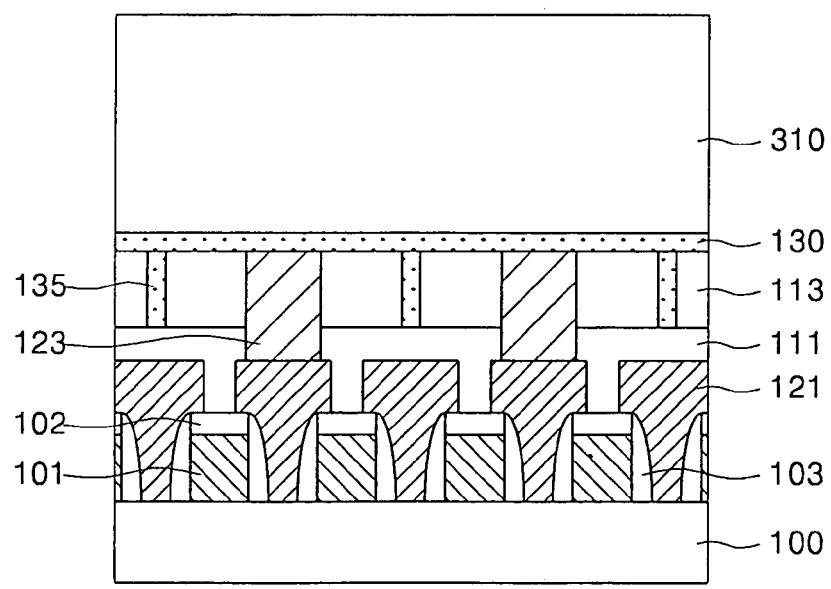

Referring to FIG. 7d, an insulating layer 130 is formed to cover the second interlayer insulating layer 113 and the capacitor contact plug 123. Then, a molding layer 310 is formed on the insulating layer 130.

Figure 7E:
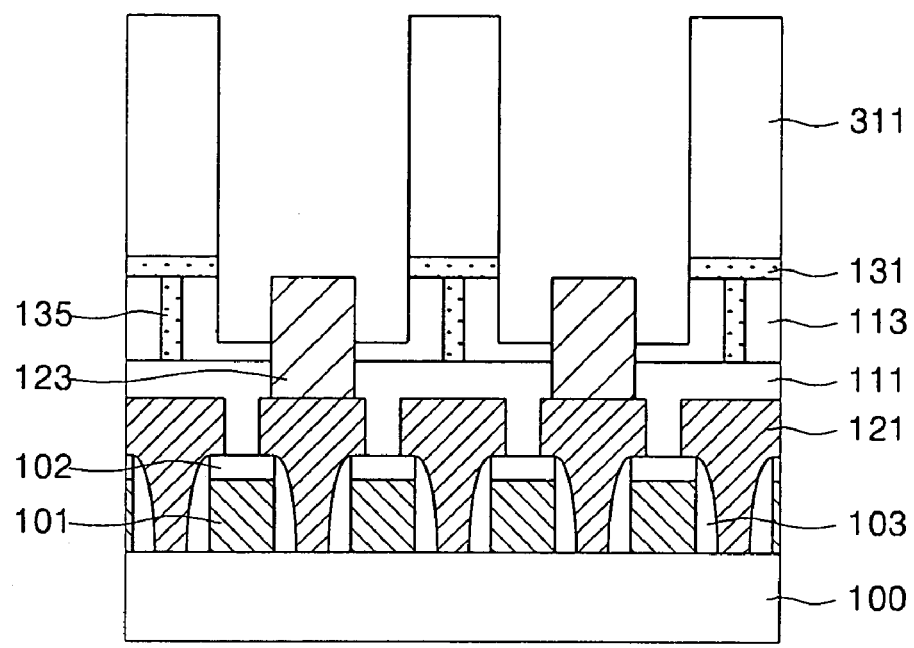

Referring to FIG. 7e, the molding layer 310 and the insulating layer 130 are patterned, so as to form a molding pattern 311 exposing the capacitor contact plug 123 at its bottom and the second interlayer insulating layer 113 around the contact plugs 123. At this time, the insulating layer 130 remaining under the molding pattern 311 forms an insulating layer pattern 131.

Then, by performing the processes shown in FIGS. 4e to 4h, a semiconductor device is fabricated.

As described above, according to an embodiment of the present invention, an isolation pattern is provided inside an interlayer insulating layer between neighboring capacitor contact plugs. The isolation pattern stops an etch, so that even though an undercut is formed inside the interlayer insulating layer during a cleaning process following the formation of a molding pattern, a connection of neighboring charge electrodes of capacitors can be effectively prevented. That is, the isolation pattern functions as a separation layer in order to prevent that the neighboring charge storage electrodes of capacitors are connected to each other.

It is noted that as described above, the method used to form a semiconductor device in one exemplary embodiment of the invention includes forming an interlayer insulating layer on a semiconductor substrate. At least two contact plugs are formed passing through the interlayer insulating layer. A trench is formed inside the interlayer insulating layer between the neighboring contact plugs. An insulating layer, being formed to cover the interlayer insulating layer and the contact plug, and to fill the trench. The insulating layer is formed from a material having an etch rate lower than that of the interlayer insulating layer. A molding layer is formed on the insulating layer. By selectively etching the molding layer using the insulating layer as an etch stop layer, a molding pattern having a first opening for exposing the insulating layer at a bottom of the first opening is formed. By selectively etching the insulating layer exposed at the bottom of the first opening, a second opening exposing the contact plugs is formed. Also, an insulating layer pattern, being formed of an insulating layer, and an isolation pattern respectively remaining inside a lower portion of the molding pattern and in the trench are provided. A charge storage electrode is formed to cover inner sidewalls of the first opening and the second opening, and to contact the contact plug. Then, the molding pattern is removed.

It is also noted that in accordance with another exemplary embodiment, a method of fabricating a semiconductor device includes forming a first contact plug on a semiconductor substrate. A first interlayer insulating layer is formed on the semiconductor substrate having the first contact plug. An isolation pattern is formed on the first interlayer insulating layer. A second interlayer insulating layer is formed on the first interlayer insulating layer having the same height as the isolation pattern. The second interlayer insulating layer is formed of a material having an etch rate higher than that of the isolation pattern. A second contact plug is formed passing through the second interlayer insulating layer and the first interlayer insulating layer between the neighboring isolation patterns, and connected to the first contact plug. An insulating layer is formed on the second interlayer insulating layer, the second contact plug, and the isolation pattern. A molding layer is formed on the insulating layer. By selectively etching the molding layer using the insulating layer as an etch stop layer, a molding pattern having a first opening exposing the insulating layer at a bottom of the first opening is formed. By selectively etching the insulating layer exposed at the bottom of the first opening, a second opening exposing the contact plug is formed. Also, an insulating layer pattern, being formed of the insulating layer remaining under the molding pattern, is formed. A charge storage electrode is formed to cover inner sidewalls of the first opening and the second opening, and to contact the contact plug. Then, the molding pattern is removed.

While the invention has been shown and described with respect to preferred embodiments thereof, it will be understood by those skilled in the art that various changes in form and detail can be made without departing from the spirit and scope of the invention. The scope of the invention is limited only by the appended claims.

What is claimed is:

1. A semiconductor device comprising:
   an interlayer insulating layer covering a semiconductor substrate;
   at least two contact plugs penetrating the interlayer insulating layer and connected to the semiconductor substrate;
   an insulating layer pattern covering the interlayer insulating layer between the neighboring contact plugs, said insulating layer pattern being formed of a material that has an etch rate lower than that of the interlayer insulating layer;
   an isolation pattern extending from the insulating layer pattern and located inside the interlayer insulating layer between the neighboring contact plugs, said isolation pattern being formed of a material having an etch rate lower than that of the interlayer insulating layer; and
   charge storage electrodes contacting a top surface and formed on sidewalls of the contact plugs.

2. The semiconductor device according to claim 1, wherein the interlayer insulating layer has a trench formed therein; and
   the isolation pattern is located inside the trench.

3. The semiconductor device according to claim 1, wherein the insulating layer pattern and the isolation pattern are formed of the same material.

4. The semiconductor device according to claim 1, wherein the isolation pattern is located inside the interlayer insulating layer between upper sidewalls of the neighboring contact plugs.

5. The semiconductor device according to claim 1, wherein each of the charge storage electrodes has a cylindrical shape.

6. The semiconductor device of claim 1, further comprising a dielectric layer having a portion that is separated from the insulating layer pattern by the charge storage electrodes and is above and below the insulating layer pattern.

7. The semiconductor device of claim 1, further comprising a dielectric layer disposed on the top surface and the sidewalls of the contact plugs having the charge storage electrodes.

8. The semiconductor device of claim 1, wherein to charge storage electrodes extend into the interlayer insulating layer below the top surface of the contact plugs.

9. A semiconductor device comprising:
   an interlayer insulating layer covering a semiconductor substrate;
   at least two contact plugs penetrating the interlayer insulating layer and connected to the semiconductor substrate;
   an insulating layer pattern covering the interlayer insulating layer between the neighboring contact plugs, said insulating layer pattern having extensions that extend into the interlayer insulating layer between the neighboring contact plugs, said insulating layer pattern and said extensions being formed of a material that has an etch rate lower than that of the interlayer insulating layer; and charge storage electrodes contacting a top surface and formed on sidewalls of said contact plugs, said charge storage electrodes being separated by said extensions of said insulating layer pattern.

10. A semiconductor device comprising:

an interlayer insulating layer covering a semiconductor substrate;

contact plugs penetrating the interlayer insulating layer and contacting the semiconductor substrate;

an insulating layer pattern covering the interlayer insulating layer between the neighboring contact plugs, the insulating layer pattern having an extension that extends into the interlayer insulating layer between the neighboring contact plugs, the insulating layer pattern and the extension being formed of a material that has an etch rate lower than that of the interlayer insulating layer; and charge storage electrodes contacting the contact plugs, the charge storage electrodes being separated by the extensions of the insulating layer pattern, and a portion of the charge storage electrodes being above and below the insulating layer pattern.

* * * * *

UNITED STATES PATENT AND TRADEMARK OFFICE
CERTIFICATE OF CORRECTION

PATENT NO.        : 7,157,764 B2                                        Page 1 of 1
APPLICATION NO.   : 11/001596
DATED             : January 2, 2007
INVENTOR(S)       : Sang-Woo Hong It is certified that error appears in the above-identified patent and that said Letters Patent is hereby corrected as shown below:

Column 8, line 51, the words "wherein to" should read -- wherein the --.

Signed and Sealed this

Second Day of September, 2008

JON W. DUDAS
*Director of the United States Patent and Trademark Office*